(12) United States Patent
Liu et al.

(10) Patent No.: US 9,398,690 B2
(45) Date of Patent: Jul. 19, 2016

(54) SUBSTRATE STRUCTURE

(71) Applicant: INNOLUX CORPORATION, Jhu-Nan, Miao-Li County (TW)

(72) Inventors: Chia-Cheng Liu, Jhu-Nan (TW);
Chia-Hsiung Chang, Jhu-Nan (TW);
An-Chang Wang, Jhu-Nan (TW);
Chao-Hsiang Wang, Jhu-Nan (TW);
Yang-Chen Chen, Jhu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 14/480,260

(22) Filed: Sep. 8, 2014

(65) Prior Publication Data

US 2016/0014895 A1  Jan. 14, 2016

(30) Foreign Application Priority Data

Jul. 8, 2014  (TW) .............................. 103123525 A

(51) Int. Cl.
*H01L 23/00* (2006.01)
*H01L 23/492* (2006.01)
*H05K 1/11* (2006.01)
*H05K 1/09* (2006.01)

(52) U.S. Cl.
CPC ................ *H05K 1/111* (2013.01); *H01L 24/06* (2013.01); *H05K 1/092* (2013.01); *H01L 23/4922* (2013.01); *H01L 24/07* (2013.01); *H01L 24/09* (2013.01); *H01L 24/26* (2013.01); *H01L 24/31* (2013.01); *H01L 24/32* (2013.01); *H01L 24/33* (2013.01); *H01L 24/83* (2013.01); *H01L 2225/1041* (2013.01); *H01L 2924/13069* (2013.01); *H01L 2924/365* (2013.01)

(58) Field of Classification Search
CPC ......... H01L 24/07; H01L 24/19; H01L 24/26; H01L 24/31–24/33; H01L 2225/1041
See application file for complete search history.

(56) References Cited

U.S. PATENT DOCUMENTS

| 2006/0103000 A1* | 5/2006 | Kurosawa ......... H01L 23/49805 257/690 |
| 2007/0187844 A1* | 8/2007 | Chen ..................... H01L 23/041 257/789 |
| 2007/0242207 A1 | 10/2007 | Fujita |

FOREIGN PATENT DOCUMENTS

| JP | 2008-263161 A | 10/2008 |
| JP | 2009-158766 A | 7/2009 |
| TW | 135989 | 6/1990 |
| TW | 201126390 | 8/2011 |

* cited by examiner

Primary Examiner — David Zarneke
(74) Attorney, Agent, or Firm — Liu & Liu

(57) ABSTRACT

A substrate structure includes a first substrate, a plurality of first bonding pads and a connecting layer. The first substrate has an element configuration area and a peripheral area. The peripheral area is disposed around the element configuration area. The first bonding pads are configured spacing at the peripheral area, and a gap is provided between two adjacent first bonding pads. The connecting layer is disposed on the first substrate and covers the first bonding pads and the gaps. The part of the connecting layer close to the element configuration area is configured with a plurality of first arc edges.

10 Claims, 3 Drawing Sheets

__US 9,398,690 B2__

SUBSTRATE STRUCTURE

CROSS REFERENCE TO RELATED APPLICATIONS

This Non-provisional application claims priority under 35 U.S.C. §119(a) on Patent Application No(s). 103123525 filed in Taiwan, Republic of China on Jul. 8, 2014, the entire contents of which are hereby incorporated by reference.

BACKGROUND

1. Technical Field

The present invention relates to a substrate structure and, in particular, to a substrate structure capable of electrically connecting with a circuit board.

2. Related Art

As the progress of technologies, the flat display devices have been widely used in various applications such as the LCD device. Since the LCD device has some superior properties such as light, thin, low power consumption and no radiation, it has gradually taken the place of the conventional CRT display device. For example, the LCD device is applied to many electronic products such as the mobile phone, portable media device, notebook computer or tablet computer.

In the case of controlling the elements on the TFT substrate, it is generally to form bonding pads at the edge of the TFT substrate for transmitting the control signals from the external control circuit board to the elements disposed on the glass substrate. Then, a conductive adhesion is coated on the bonding pads, and the glass substrate and the control circuit board is correspondingly bonded by thermo-compression. Accordingly, the control signals can be transmitted to the TFT substrate through the control circuit board, the conductive adhesion and the bonding pads, thereby controlling the action of the element.

However, in the conventional art, the conductive adhesion provided for bonding the bonding pads and the control circuit board simply covers the bonding pads. After a long term usage, the conductive adhesion may lose the ability of blocking the external water and oxygen, so the bonding pads will contact the undesired water or oxygen and thus get rusty, which will cause the malfunction of the signal transmission and the device.

SUMMARY

An objective of the present invention is to provide a substrate structure capable of blocking external water and oxygen and thus preventing the rusty of bonding pads as well as providing a better bonding adhesion.

To achieve the above objective, the present invention discloses a substrate structure including a first substrate, a plurality of bonding pads and a connecting layer. The first substrate has an element configuration area and a peripheral area. The peripheral area is disposed around the element configuration area. The first bonding pads are configured spacing at the peripheral area, and between two adjacent first bonding pads has a gap. The connecting layer is disposed on the first substrate and covers the first bonding pads and the gaps. The part of the connecting layer close to the element configuration area is configured with a plurality of first arc edges.

In one embodiment, the first bonding pads are configured spacing along a direction.

In one embodiment, the first arc edges are arranged corresponding to the gaps, respectively.

In one embodiment, one of the first arc edges has a maximum width along the direction larger than a maximum width of the corresponding gap along the direction.

In one embodiment, the first bonding pads have a plurality of first edges close to the element configuration area, and the connecting layer covers the first edges.

In one embodiment, the first bonding pads further have a plurality of second edges opposite to the first edges, and the connecting layer covers the second edges.

In one embodiment, a part of the connecting layer away from the element configuration area has a plurality of second arc edges.

In one embodiment, the substrate structure further includes a second substrate connecting with the first substrate through the connecting layer. The second substrate has a plurality of second bonding pads correspondingly disposed and electrically connected to the first bonding pads, respectively.

In one embodiment, the substrate structure further includes a plurality of driving electrodes and a plurality of sensing electrodes disposed in the element configuration area.

In one embodiment, the first substrate is a protective substrate, a color filter substrate, or a TFT substrate.

As mentioned above, in the substrate structure of the invention, the peripheral area of the first substrate is disposed around the element configuration area, the first bonding pads are disposed spacing at the peripheral area, and between two adjacent first bonding pads has a gap. In addition, the connecting layer is disposed on the first substrate and covers the first bonding pads and the gaps, and a part of the connecting layer close to the element configuration area is configured with a plurality of first arc edges. Accordingly, the connecting layer can perfectly protect the first bonding pads. Compared with the conventional art, the substrate structure of the invention can still effectively block the external water or oxygen after a long term usage. This feature can prevent the rusty of the first bonding pads and provide better bonding adhesion.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements.

Figure 1A:
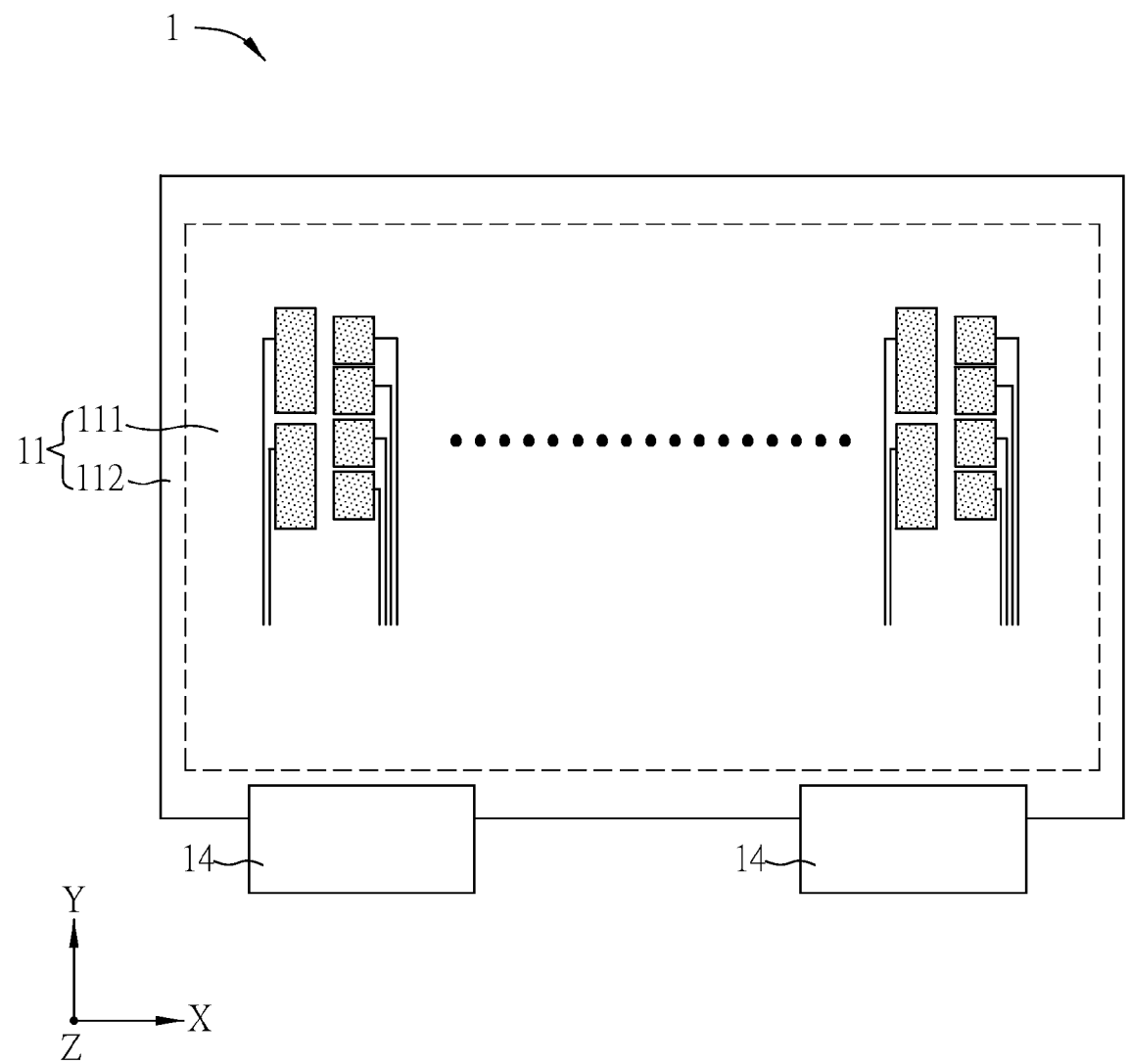
FIG. 1A is a top view of a substrate structure according to a preferred embodiment of the invention.
Figure 1B:
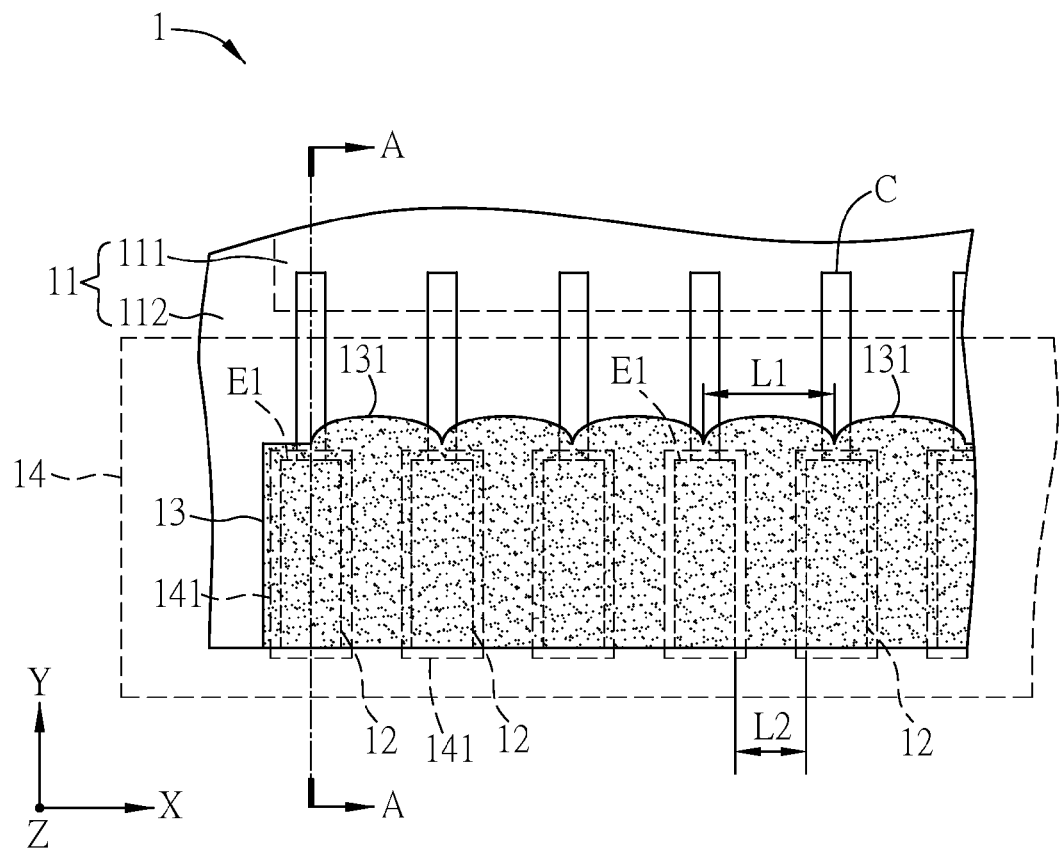
FIG. 1B is a partial enlarged view of the substrate structure of FIG. 1A.
Figure 1C:
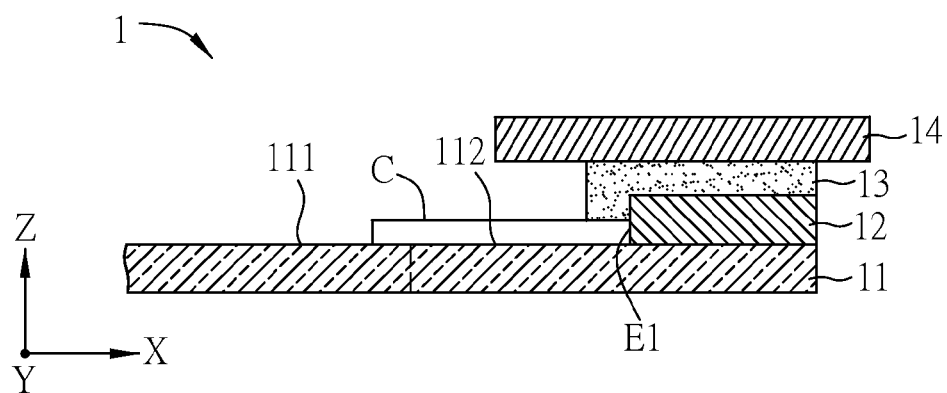
FIG. 1C is a sectional view of FIG. 1B along the line A-A.

FIG. 1A is a top view of a substrate structure 1 according to a preferred embodiment of the invention, FIG. 1B is a partial enlarged view of the substrate structure 1 of FIG. 1A, and FIG. 1C is a sectional view of FIG. 1B along the line A-A.

With reference to FIGS. 1A to 1C, the substrate structure 1 includes a first substrate 11, a plurality of first bonding pads 12 and a connecting layer 13. In addition, the substrate structure 1 can further include a second substrate 14. To make the following description much clear, FIG. 1A only shows the relationship of the first substrate 11 and the second substrate 14 while the other elements (e.g. the first bonding pads 12, the connecting layer 13 and the wires C) are not shown, and the second substrate 14 shown in FIG. 1B is represented by dotted lines. Besides, FIG 1A shows two second substrates 14 for example.

The first substrate 11 has an element configuration area 111 (in-plane) and a peripheral area 112 (out-of-plane). The peripheral area 112 is disposed around the element configuration area 111. In this embodiment, the element configuration area 111 is located at the central area of the first substrate 11 for configuring the circuit structure. The peripheral area 112 is disposed around the periphery of the element configuration area 111. Herein, the first substrate 11 can be made of transparent material such as glass, quartz or the likes, plastics, rubbers, glass fibers or other polymer materials. Alternative, the first substrate 11 can also be made of opaque material such as metal-glass fiber composite plate, metal-ceramic composite plate, printed circuit board, or other materials, and this invention is not limited. To be noted, the element configuration area 111 represents an area for configuring circuit structures or devices, so the portion for only configuring conducting wires is not included in the element configuration area 111 of the invention. For example, as shown in FIG. 1A, when a plurality driving electrodes and a plurality of sensing electrodes (Tx and Rx) are configured in the element configuration area 111, the first substrate 11 can be provided with the touch control function. In other embodiments, when the TFTs or pixel electrodes are configured in the element configuration area 111, the first substrate 11 can function as a TFT substrate for the flat display device.

As shown in FIGS. 1B and 1C, the first bonding pads 12 are disposed spacing at the peripheral area 112, and between any adjacent two of the first bonding pads 12 has a gap. In this embodiment, a plurality of first bonding pads 12 are configured at the left bottom of the peripheral area 112 of the first substrate 11. The first bonding pads 12 are arranged spacing along a direction X, so that every two adjacent first bonding pads 12 have a gap located therebetween. The shape of the first bonding pads 12 (top view) is, for example but not limited to, a square, and the first bonding pads 12 can be made of, for example but not limited to, transparent conductive layer (e.g. ITO or IZO). Besides, the first bonding pads 12 can be electrically connected with the elements in the element configuration area 111 via wires C (e.g. made by copper).

The connecting layer 13 is disposed on the first substrate 11 by, for example, coating for completely covering the first bonding pads 12 and the gaps. In this case, the connecting layer 13 can be, for example but not limited to, an anisotropic conductive film (ACF). The ACF is synthesized by resin and conductive particles and is mainly used to connect two different materials and wires. The ACF has the conductivity in the normal direction and the insulation property in the planar direction. Besides, the ACF also has the functions of waterproof, adhesion, electrical conduction and insulation. In other embodiments, the connecting layer 13 can be an adhesion.

In this embodiment, the first bonding pads 12 include a plurality of first edges E1 located adjacent to the element configuration area 111, and the connecting layer 13 completely covers the first edges E1. The connecting layer 13 not only covers the first edges E1 of the first bonding pads 12 and the gaps between the first bonding pads 12, but also extends toward the element configuration area 111. Besides, the part of the bonding layer 13 close to the element configuration area 111 has a plurality of first arc edges 131, which are disposed corresponding to the gaps. Preferably, the first arc edges 131 are disposed opposite to the gaps one by one, and the peak of each first arc edge 131 is located corresponding to the center of one gap. The term "arc edge" is not limited to the perfect arc shape, and any shape with a protruded center peak will be acceptable.

Moreover, one of the first arc edges 131 has a maximum width L1 along the direction X, which is larger than a maximum width L2 of the corresponding gap along the direction X. In this embodiment, all first arc edges 131 have a maximum width L1 along the direction X larger than the maximum width L2 of the corresponding gaps along the direction X. Of course, in other embodiments, some first arc edges 131 have a maximum width L1 along the direction X larger than the maximum width L2 of the corresponding gaps along the direction X, but the other first arc edges 131 have a maximum width L1 along the direction X smaller than the maximum width L2 of the corresponding gaps along the direction X.

The second substrate 14 is connected to the first substrate 11 via the connecting layer 13. In this case, the second substrate 14 is connected to the first substrate 11 by thermocompression. The second substrate 14 has a plurality of second bonding pads 141, which are disposed corresponding to and electrically connected to the first bonding pads 12, respectively. Since the first bonding pads 12 and the second bonding pads 141 are disposed correspondingly, they can be electrically connected through the connecting layer 13 for transmitting signals. In this embodiment, the second substrate 14 is, for example but not limited to, a flexible print circuit (FPC) board and is made of copper. Of course, in other embodiments, the second substrate 14 can also be made by different kinds of circuit board such as a printed circuit board (PCB) or a rigid-flex board. Accordingly, the electrical signals can be transmitted between the first substrate 11 and the second substrate 14 through the wires C, the first bonding pads 12, the connecting layer 13 and the second bonding pads 141.

As mentioned above, the connecting layer 13 is disposed on the first substrate 11 and completely covers the first bonding pads 12 and the gaps. Besides, the part of the connecting layer 13 close to the element configuration area 111 has a plurality of first arc edges 131, so that the connecting layer 13 can perfectly protect the entire first bonding pads 12. Compared with the conventional art, the connecting layer 13 of the substrate structure 1 of the embodiment can still effectively block the external water or oxygen after a long term usage, thereby preventing the rusty of the first bonding pads 12 and providing better bonding adhesion with the second substrate 14.

Figure 2A:
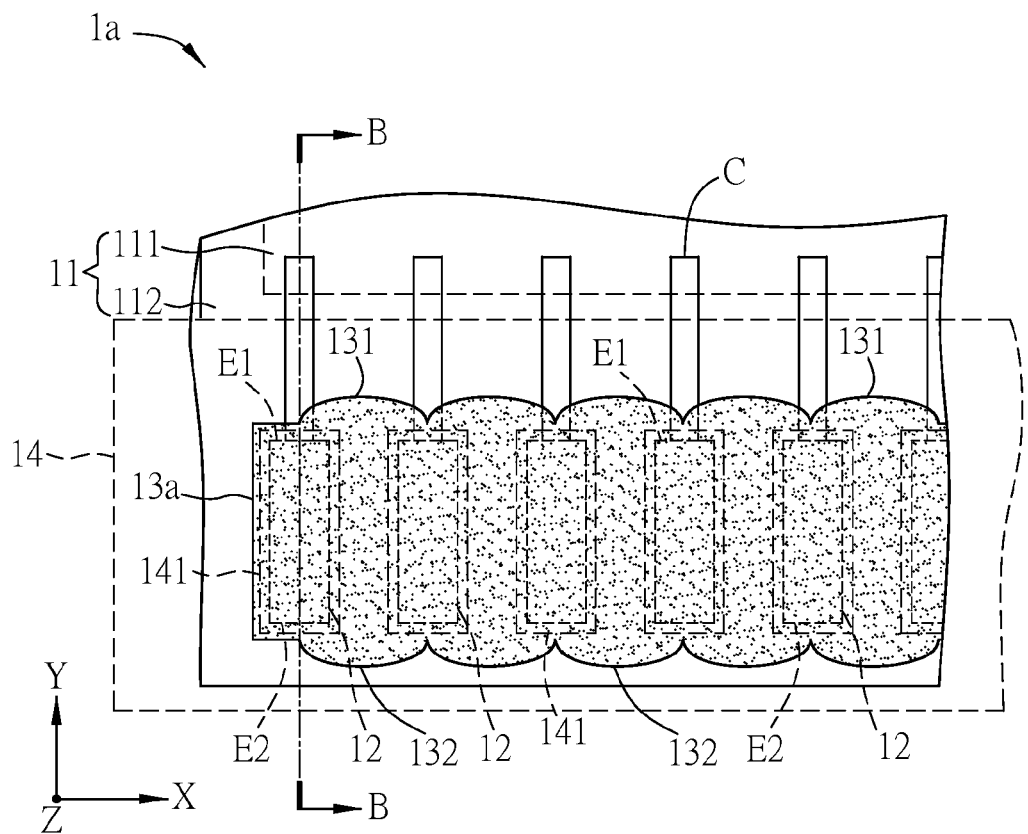
FIG. 2A is a partial enlarged view of a substrate structure according to another preferred embodiment of the invention.
Figure 2B:
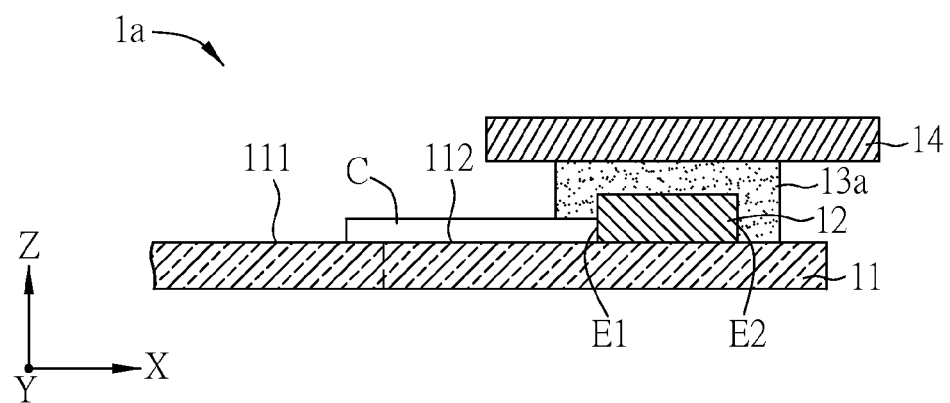
FIG. 2B is a sectional view of FIG. 2A along the line B-B.

FIG. 2A is a partial enlarged view of a substrate structure 1a according to another preferred embodiment of the invention, and FIG. 2B is a sectional view of FIG. 2A along the line B-B.

Different from the substrate structure 1 of FIG. 1A, the first bonding pads 12 of the substrate structure 1a further have a plurality of second edges E2 corresponding to the first edges E1. The second edges E2 are located away from the element configuration area 111, and are not positioned in the region of the peripheral area 112 instead of the edge of the first substrate 11. Accordingly, the connecting layer 13a extends toward the part away from the element configuration area 111 to cover the second edges E2. In addition, the part of the connecting layer 13a away from the element configuration area 111 has a plurality of second arc edges 132, which are also located within the region of the peripheral area 112. The first arc edges 131 are disposed corresponding to the second arc edges 132, and the numbers thereof can be the same or different. In this embodiment, the numbers of the first arc edges 131 and the second arc edges 132 are the same, and they are aligned one by one. Since the connecting layer 13a has a plurality of arc edges located corresponding to the opposite sides of the first bonding pads 12, it is possible to more effectively block the external water or oxygen so as to protect the inside first bonding pads 12.

The other technical features of the substrate structure 1a can be referred to those of the substrate structure 1, so the detailed description thereof will be omitted.

To be noted, the above-mentioned substrate structure 1 (or 1a) can be applied to, for example, touch panels, display panels or touch display panels, or any other types of substrate structures.

Taking an (out-cell) touch panel as an example, the first substrate is, for example, a glass substrate, and the circuit structure disposed in the element configuration area is a touch sensing circuit, which includes a plurality of driving electrodes and a plurality of sensing electrodes. In this case, the substrate structure configured with the touch sensing circuit is bonded with a display panel so as to form a touch display panel. Of course, it is possible to configure an additional cover lens for protecting the touch display panel. Otherwise, in the aspect of an OGS touch panel, the first substrate configured with the touch sensing circuit is a protective substrate itself, so the additional cover lens is not needed.

In the aspect of an on-cell touch panel, the first substrate is, for example, a color filter substrate, and the circuit structure is a touch sensing circuit, which can be directly formed on the outside surface of the color filter substrate. Then, the color filter substrate is bonded with the TFT substrate so as to form a touch display panel (a liquid crystal layer can be formed between the substrates).

In the aspect of an in-cell touch panel, the first substrate is, for example, a color filter substrate, and the circuit structure is a touch sensing circuit, which can be directly formed on the surface of the color filter substrate opposite to the TFT substrate. Alternatively, the first substrate can also be a TFT substrate, and the circuit structure is a touch sensing circuit, which can be directly formed on the surface of the TFT substrate opposite to the color filter substrate.

In another embodiment, the first substrate is, for example, a TFT substrate, and the circuit structure is, for example, a display circuit structure, which includes TFT array structure and other associated elements. This substrate structure can be applied to a display panel such as an LCD panel or an OLED display panel, wherein the circuit elements on the TFT substrate can be controlled through the second substrate.

To sum up, in the substrate structure of the invention, the peripheral area of the first substrate is disposed around the element configuration area, the first bonding pads are disposed spacing at the peripheral area, and between two adjacent first bonding pads has a gap. In addition, the connecting layer is disposed on the first substrate and covers the first bonding pads and the gaps, and a part of the connecting layer close to the element configuration area is configured with a plurality of first arc edges. Accordingly, the connecting layer can perfectly protect the first bonding pads. Compared with the conventional art, the substrate structure of the invention can still effectively block the external water or oxygen after a long term usage. This feature can prevent the rusty of the first bonding pads and provide better bonding adhesion.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A substrate structure, comprising:
   a first substrate having an element configuration area and a peripheral area, wherein the peripheral area is disposed around the element configuration area;
   a plurality of first bonding pads configured spacing at the peripheral area, wherein between adjacent two of the first bonding pads has a gap; and
   a connecting layer disposed on the first substrate and covering the first bonding pads and the gaps, wherein a part of the connecting layer close to the element configuration area is configured with a plurality of first arc edges.

2. The substrate structure of claim 1, wherein the first bonding pads are configured spacing along a direction.

3. The substrate structure of claim 2, wherein the first arc edges are arranged corresponding to the gaps, respectively.

4. The substrate structure of claim 3, wherein one of the first arc edges has a maximum width along the direction larger than a maximum width of the corresponding gap along the direction.

5. The substrate structure of claim 1, wherein the first bonding pads have a plurality of first edges close to the element configuration area, and the connecting layer covers the first edges.

6. The substrate structure of claim 5, wherein the first bonding pads further have a plurality of second edges opposite to the first edges, and the connecting layer covers the second edges.

7. The substrate structure of claim 1, wherein a part of the connecting layer away from the element configuration area has a plurality of second arc edges.

8. The substrate structure of claim 1, further comprising:
   a second substrate connecting with the first substrate through the connecting layer, wherein the second substrate has a plurality of second bonding pads correspondingly disposed and electrically connected to the first bonding pads, respectively.

9. The substrate structure of claim 1, further comprising:
   a plurality of driving electrodes and a plurality of sensing electrodes disposed in the element configuration area.

10. The substrate structure of claim 1, wherein the first substrate is a protective substrate, a color filter substrate, or a TFT substrate.

* * * * *